United States Patent [19]
Palara et al.

[11] Patent Number: 4,575,686
[45] Date of Patent: Mar. 11, 1986

[54] OUTPUT STAGE FOR POWER AMPLIFIERS

[75] Inventors: Sergio Palara, Bareggio; Aldo Torazzina, Monza, both of Italy

[73] Assignee: SGS-ATES Componenti Elettronici S.p.A., Catania, Italy

[21] Appl. No.: 634,002

[22] Filed: Jul. 24, 1984

[30] Foreign Application Priority Data

Aug. 5, 1983 [IT] Italy .............................. 22466 A/83

[51] Int. Cl.$^4$ .............................................. H03F 3/26
[52] U.S. Cl. .................................... 330/273; 330/263; 330/267
[58] Field of Search ............... 330/263, 267, 273, 297, 330/296

[56] References Cited

U.S. PATENT DOCUMENTS 4,394,625 7/1983 Sakai ................................... 330/267

Primary Examiner—James B. Mullins
Assistant Examiner—G. Wan
Attorney, Agent, or Firm—Guido Modiano; Albert Josif

[57] ABSTRACT

The output stage for power amplifiers, in particular of the minimum drop, low tension type, is intended for use with apparatus which do not require a high output current, which output stage can operate at a lower minimum voltage supply than comparable known stages. The output stage comprises upper and lower sections interposed between a power supply line and a ground line, each section including transistors across which voltage drops ($V_{CE\,sat}$, $V_{BE}$) appear and forming current sources for each section, diodes, and at least one current mirror circuit of the multiplying type adapted to determine as a first approximation the current gain of each section. The minimum voltage drop between the power supply line and ground line, as computed for any electric line connecting the power supply line and ground line, never exceeds the value of $V_{BE}+2V_{CE\,sat}$.

5 Claims, 2 Drawing Figures

OUTPUT STAGE FOR POWER AMPLIFIERS

BACKGROUND OF THE INVENTION

This invention relates to an output stage for power amplifiers, in particular of the minimum drop, low tension type, for use with apparatus which do not require a high output current.

Circuits of this general type are known and commercially available, like for instance the one shown diagramatically in FIG. 1.

Said circuit essentially comprises current mirror stages which are arranged substantially in mutual cascade relationship and effective to amplify a signal $V_i$ and to supply it in this amplified form to a load. The circuit includes a first line, located downstream of the input transistor $T_{10}$ and formed by the transistor $T_2$, current mirror including the transistor $T_3$ and diode $D_1$, and current mirror including the transistor $T_4$ and diode $D_2$. The other line comprises the transistor $T_5$, current mirror including the transistor $T_6$ and diode $D_8$, and the current mirror including the transistor $T_7$ and diode $D_9$. A circuit of this type can provide a maximum peak-to-peak range for the output signal which is equal to $$V_s - V_{CE\ sat\ 4} - V_{CE\ sat\ 7}$$

where $V_s$ is the power supply voltage, and $V_{CE\ sat}$ is the saturation voltages of the two $T_4$ and $T_7$ across the collector and emitter electrodes.

The current mirrors used in this circuit are of the multiplying type, i.e. the ratio of the currents supplied by the transistor to the diode of each circuit is equal to the ratio between the component surface area. In particular, by respectively designating with $A_1$, $A_2$, $A_3$, $A_4$, $A_5$, $A_6$, $A_7$, $A_8$ and $A_9$ and areas of the components $D_1$, $D_2$, $T_3$, $T_4$, $T_5$, $T_6$, $T_7$, $D_8$, and $D_9$, the following output currents are obtained:

$$I_5 = (A_4/A_2) \times (A_3/A_1) \times (I_{C1} \times -I_1)$$

$$V_{smin} = (A_7/A_9) \times (A_6/A_8) \times I_4 = (A_7/A_9) \times (A_6/A_8) \times I_1$$

The prior circuit has a minimum operating voltage of $$V_{smin} = 2V_{BE} + 2V_{CE\ sat}$$

In fact, in analyzing the prior circuit, it appears that there are lines connecting the power supply to ground whereon, if the circuit can continue to operate, the voltage should not drop below that value. In particular, in analyzing the line including the generator $I_2$, diodes $D_{11}$ and $D_{12}$, and generator $I_3$, it may be seen that if the generators have a minimal voltage drop thereacross equal to $V_{CE\ sat}$, and the diodes have a drop of $V_{BE}$, the above specified minimum operating voltage is obtained. Consequently, even if there exist paths requiring a minimum operating voltage below that value, the circuit as a whole cannot operate if the voltage supply drops below the value indicated. From a practical standpoint, this means that the circuit cannot operate where the voltage supply drops below about 1.4 V, taking into account that in general the minimum value for $V_{BE}$ is approximately in the 0.6 to 0.65 V range, whilst the minimum value of the saturation voltage $V_{CE\ sat}$ is about 100 mV. Thus, where the circuit is required to reliably operate down to a minimum voltage supply of about 1 Volt, the circuit shown cannot be used.

SUMMARY OF THE INVENTION

In view of the foregoing situation, it is a primary object of this invention to provide an output stage for power amplifiers, in particular intended for low output currents, which can obviate the problems encountered with prior stage designs, and especially such as to have a minimum operating voltage below 1 Volt.

Another object of this invention is to provide an output stage for power amplifiers as indicated, which has a minimum operating voltage which is lower than that of prior circuits for a given peak-to-peak range of the output signal.

It is a further object of the invention to provide an output stage for power amplifiers as indicated, which was lower power requirements and can boost the output current in accordance with a required output current level.

A not unimportant object of this invention is to provide an output stage for power amplifiers as indicated, which has a simple construction employing commercially readily available components which can be easily integrated to keep manufacturing costs reasonably low.

These and other objects, such as will be apparent hereinafter, are achieved by an output stage for power amplifiers, according to the invention, comprising upper and lower sections interposed to power supply and ground lines, each of said sections including transistors having emitter, base, and collector electrodes and voltage drops ($V_{CE\ sat}$, $V_{BE}$) thereacross and forming current sources for each section, diodes, and at least one current mirror circuit of the multiplying type determining as a first approximation the current gain of each of said sections, characterized in that the voltage drop across the power supply and ground lines, for any electric line interconnecting said power supply and ground lines, is under no circumstances greater than the sum of the voltage drop across base and emitter electrodes in the transistor linear forward region plus twice the voltage drop across collector and emitter electrodes in the transistor saturation region ($V_{BE} + 2 \times V_{CE\ sat}$).

BRIEF DESCRIPTION OF THE DRAWING

Further features and advantages will be more readily understood from the following description of a preferred, but not exclusive, embodiment of the invention, with reference to the accompanying illustrative drawing, where.

DESCRIPTION OF THE PREFERRED EMBODIMENTS

Figure 1:
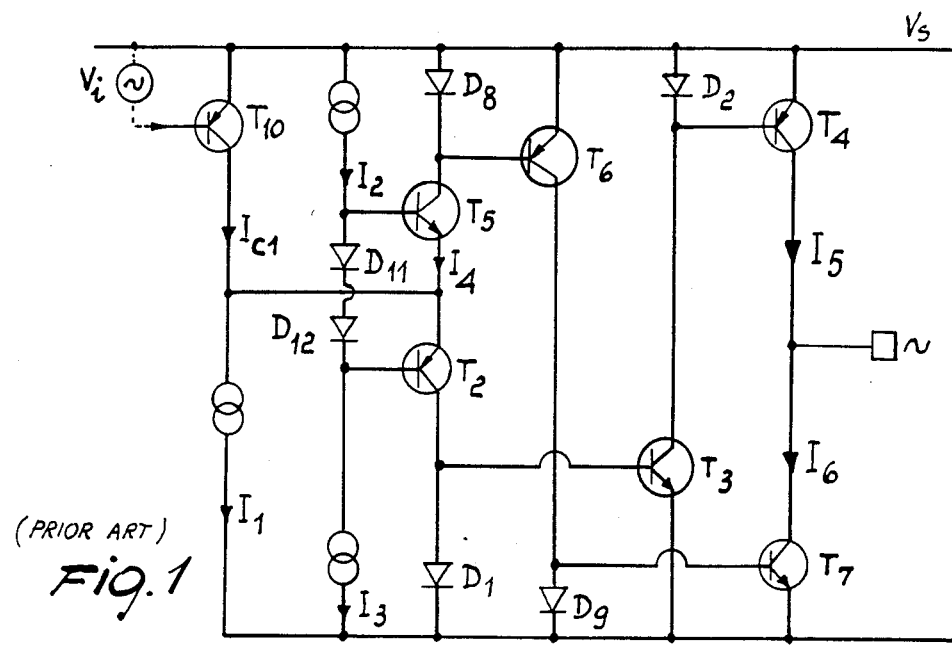
FIG. 1 is a basic circuit diagram of an output stage of conventional design.

FIG. 1 of the drawing shows the prior circuit, already described in the preamble, and accordingly, no further discussed hereinafter.

Figure 2:
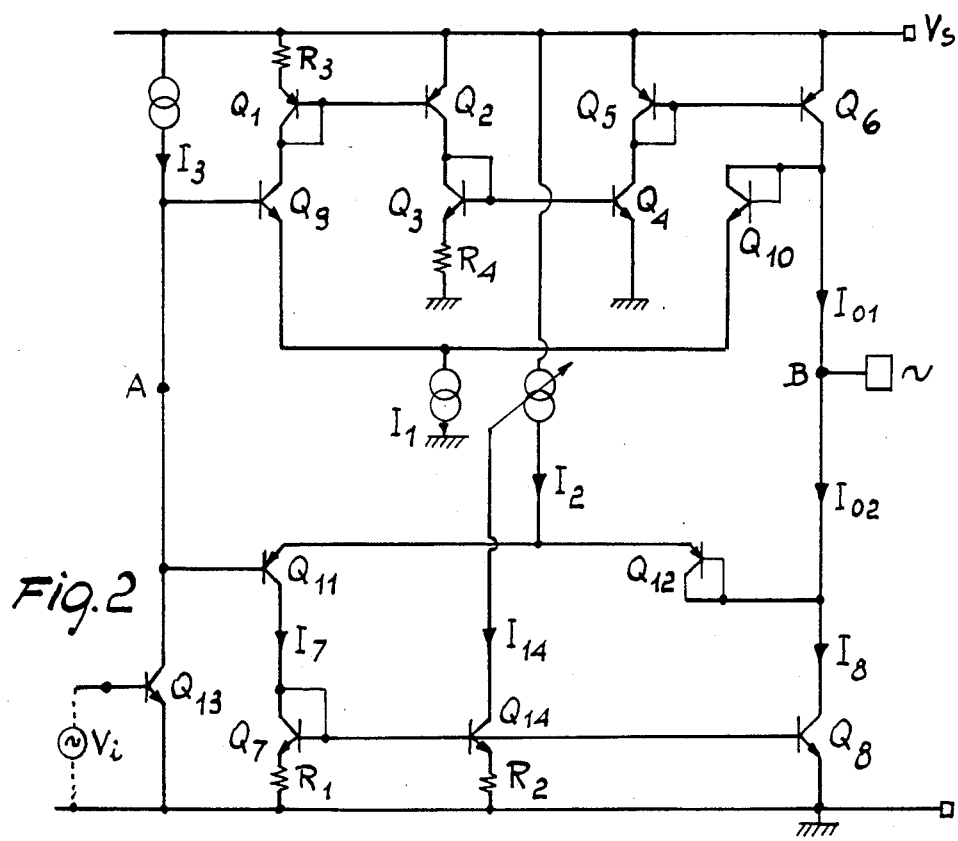
FIG. 2 is a basic circuit diagram of the output stage for power amplifiers, according to the invention.

Making reference now to FIG. 2 of the drawing, a preferred embodiment of this power amplifiers output stage is shown to comprise essentially two, upper and lower, sections interposed to a power supply line, indicated at $V_s$, and a ground line, and being effective to amplify an input signal $V_i$ and pass it to the load at B. More specifically, the upper stage or section is formed by three cascade connected current mirror circuits including, the first a transistor $Q_1$ which is diode connected and a transistor $Q_2$, the second a diode connected transistor $Q_3$ and transistor $Q_4$, and the third a diode connected transistor $Q_5$ and output transistor $Q_6$. Said section further comprises transistors $Q_9$ and $Q_{10}$, and generator $I_1$. The lower section comprises a transistor $Q_{11}$ and a diode connected transistor $Q_{12}$ and the mirror formed by the diode connected transistor $Q_7$ and transistor $Q_8$. Included with this lower section is the variable current source $I_2$, the variability whereof is obtained by means of a transistor $Q_{14}$ having its base connected to the bases of the transistors $Q_7$ and $Q_8$, such as to detect variations in the required output current in the manner to be explained hereinafter. The circuit is completed by a current generator $I_3$, input transistor $Q_{13}$, and emitter resistors $R_1$, $R_2$, $R_3$ and $R_4$, the functions whereof will be explained hereinafter.

Calling $A_1, A_2, A_3, A_4, A_5, A_6, A_7, A_8$ the areas of the individual transistors with corresponding subscripts for the circuit in question, the following current gains are obtained, $$h_{FEssup} = I_{01}/I_1 = (A_2/A_1) \times (A_4/A_3) \times (A_6/A_5); I_{02}/I_2 = A_8/A_7$$

where, as a first approximation, the base currents and amplifying effects of the emitter resistors $R_1$-$R_4$ are not taken into account.

Actually, to compute the gain of the individual sections, the emitter resistors should be considered. In fact, for example, with reference to the lower section and ignoring for the time being the effect of the drive circuit formed by the transistor $Q_{14}$ and its resistor $R_2$, it may be seen that the ratio of the currents $I_8$ and $I_7$ is not exactly equal to the ratio of the areas $A_8$ and $A_7$, but rather varies as the resistance $R_1$ varies. For a better understanding of the influence of resistor $R_1$ on the gain of this current mirror circuit, it will be assumed for convenience of illustration that the current flowing through the transistor $Q_7$ be 1 mA, and the resistance $R_1$ be 60 Ohms. At the resistor, therefore, there will occur a voltage drop of 60 mV which adds to the $V_{BE}$ of the transistor $Q_7$ and provides the voltage drop across the base electrode and emitter electrode of the transistor $Q_8$. Consequently, according to the exponential law linking the voltage drop across the base and emitter to the collector current of the transistor, a flowing current increase of 10 is obtained for $Q_8$, that is, said current will be ten times greater than the value to be obtained without $R_1$. Thus, by suitably selecting the value of the emitter resistance $R_1$, it becomes possible to achieve increased gain values. The same would apply, of course, to the resistors $R_3$ and $R_4$ of the upper stage.

A peculiar aspect of this circuit is that any electric line connecting the power supply line $V_s$ to ground has a voltage drop across the individual components which never exceeds $V_{BE} + 2V_{CE\ sat}$. Taking, as an example, the line formed by the source $I_3$, transistor $Q_9$, and source $I_1$, that line shows voltage drops due to saturation of the two sources and to the drop across the base and emitter electrodes of the transistor $Q_9$. In this case, taking the drop due to saturation as equal to 100 mV and assuming $V_{BE} = 600$ mV, an overall drop of 800 mV is obtained. The same would apply to all the other electric lines between the power supply line and ground line. Thus, this circuit can operate down to minimum voltages of this magnitude, and in the instance of battery powered apparatus applications, can ensure an improved utilization of the batteries down to that critical minimum value.

Another advantageous feature of this circuit is that a drive circuit has been provided which permits variation of the current supplied from the source $I_2$ according to the output current requirements, and in particular, the use of a current source supplying very low value currents in normal circumstances, while the value of the current supplied thereby can be increased only where necessary. To make this phenomenon more clearly understood, let us assume, for example, that the output requires a current of 100 mA and that the ratio of the areas of the transistors $Q_8$ and $Q_7$ is 20 for stability reasons. In such a case, the source $I_2$ shall have to supply 5 mA to the transistor $Q_7$, in order to provide the desired output current value. However, if the overall current of the amplifier as a whole and not just the output circuit is required to be of that magnitude, then the current supplied to this branch alone cannot have said value and a circuit is needed which increases the current $I_2$ as the output current demand varies. This variation is provided by the transistor $Q_{14}$, whose base is connected to the base of the transistor $Q_8$ and can sense and detect the current variations imposed by the load. In fact, with a given ratio of the areas of the transistor $Q_8$ and transistor $Q_{14}$, in the event of an increase in the output current $I_8$, a current $I_{14}$ will flow through $Q_{14}$ which is equal to the $A_{14}$ to $A_8$ ratio; therefore, the source $I_2$ (in turn comprising, for example, a current mirror) shall have to supply an additional current $I_2$ which is equal to the current $I_{14}$ multiplied by the area ratio of the transistors forming the current mirror of the source. This current increase, on being supplied to the transistor $Q_7$, will be mirrored in the transistor $Q_8$, thus producing the desired effect. In this case, the resistor $R_1$ on the emitter of the transistor $Q_7$ also serves a function of limitation and stabilization of the effect just described. In fact, as the current $I_7$ flowing through the transistor $Q_7$ and resistor $R_1$ grows, the voltage across the latter increases and the voltage drop across the emitter and base electrodes of the transistor is decreased. This decrease in $V_{BE}$ due to the interdependence between the collector current and the voltage $V_{BE}$ results in self-limitation and stabilization of the current demand on the source $I_2$. It may be appreciated, moreover, that as the value of the resistor $R_1$ changes, the current may be limited to desired values.

It will be apparent from the foregoing description that the invention fully achieves its objects. In fact, a simple and readily manufactured circuit has been provided which has a minimum operating voltage which is markedly lower than with prior circuits, thanks to that each electric path connecting the power supply line to the ground line has a total voltage drop of $V_{BE} + 2V_{CE\ sat}$. Furthermore, the circuit can operate with relatively low sources of current $I_1$ and $I_2$, thus lowering the circuit power requirements. Finally, the provision of a drive circuit comprising the transistor $Q_{14}$ enables the currents supplied by the source $I_2$ to be varied, for example, according to output current requirements.

The invention as herein disclosed is susceptible to many modifications and variations without departing from the scope of the instant inventive idea.

All of the details, moreover, may be replaced with other, technically equivalent elements.

We claim:

1. An output stage for power amplifiers, comprising an input transistor in series with a first current source so as to define a first common point, a first section and a second section arranged in parallel between a power supply and ground, each section including:

- a first transistor having its base connected to said first common point;
- a second current source, said second current source of said first section being interposed between the emitter of said first transistor and the ground and said second current source of said second section being interposed between the emitter of said first transistor and the power supply; said second current source and said first transistor defining a second common point;
- at least one current mirror circuit formed by a first diode and a second transistor, said first diode of said first section being interposed between the collector of said first transistor and the power supply and said first diode of said second section being interposed between the collector of said first transistor and the ground, said second transistor of said first section having its emitter connected to the power supply, and said second transistor of said second section having its emitter connected to the ground;
- a second diode connected between said second common point and the collector of said second transistor, the second transistor of said first and second sections being connected together and to a stage output thereby the voltage of the power supply can drop up to the value defined by the following expression $$V_{BE} + 2 \times V_{CE\,sat}$$

wherein $V_{BE}$ represents the voltage across the base-emitter junction in the transistor forward region and $V_{CE\,sat}$ represents the voltage across the collector-emitter junction in the transistor saturation region, while maintaining the device in operation.

2. An output stage according to claim 5, comprising a plurality of current mirror circuits arranged in cascade.

3. An output stage according to claim 5, wherein the diodes of said at least one current mirror circuit are formed by diode-connected transistors having emitters connected to respective resistors increasing the current gain of each section.

4. An output stage according to claim 5, further comprising a drive circuit interposed between said at least one current mirror circuit and said second current source for detecting variations in the output current demand and driving said second current source for changing the current supplied in accordance with said output current variations.

5. An output stage according to claim 4, wherein said drive circuit comprises a transistor having collector, base and emitter electrodes, said collector electrode of said drive circuit being connected to said second current source, said base electrode of said drive circuit being connected to the base of transistor forming said at least one current mirror circuit, and said emitter electrode of said drive circuit being connected to ground through an intervening stabilizing resistor.

* * * * *